United States Patent [19]

Curtis

[11] 4,173,389
[45] Nov. 6, 1979

[54] MOLDED OPTICAL FIBER CONNECTOR

[75] Inventor: Lyn Curtis, Fair Haven, N.J.

[73] Assignee: Bell Telephone Laboratories, Incorporated, Murray Hill, N.J.

[21] Appl. No.: 837,398

[22] Filed: Sep. 28, 1977

[51] Int. Cl.² .......................... G02B 5/14; B29D 11/00
[52] U.S. Cl. ...................................... 350/96.20; 264/1
[58] Field of Search ............... 350/96.20, 96.21, 96.22; 264/1

[56] References Cited

U.S. PATENT DOCUMENTS

| 3,628,036 | 12/1971 | Humphrey | 350/96.21 X |
| 3,996,526 | 12/1976 | d'Auria | 350/96.20 X |
| 4,107,242 | 8/1978 | Runge | 350/96.20 X |

Primary Examiner—Rolf G. Hille
Attorney, Agent, or Firm—John Francis Moran

[57] ABSTRACT

In a disconnectable low-loss optical connector for optical fiber light guides, the fiber is precisely located in the body of the connector form in a molding die cavity. The portion of the cavity that forms the mating surface of the molded connector body corresponds to a frustum of a cone whose axis is a reference point for determining the exact location of the fiber. The fiber is placed in a sleeve-like member to form a subassembly around which the connector body is molded. One end of the member has a port located in the tip of the frustum of the molding cavity and aids in the precise formation of the mating surface. When the molding cavity is filled to form the molded connector body, gas pockets which form and produce voids in the molding material are accepted in a flow of filler material and prevented from interfering with the formation of the mating surface. The fiber which protrudes out of the tip of the mating surface is then cut and polished to form the junction end. If a shortened, modified sleeve-like member is used instead of the first-mentioned member during the molding process, the fiber may be terminated at a device encapsulated during the connector formation. This device may be either a light source or light detector so that the connector includes a means of interfacing conventional electronic circuitry with the light wave milieu.

10 Claims, 5 Drawing Figures

MOLDED OPTICAL FIBER CONNECTOR

BACKGROUND OF THE INVENTION

This invention relates to optical transmission apparatus and, more specifically, to a connector device for optical fiber light-wave guides and method of fabricating same.

In recent years, significant advances have been made in the technology of transmitting information with low loss by light beams through thread-like optical glass fibers. The use of light as a carrier of information is of great commercial interest since optical fibers promise much more channel capacity than microwave waveguides and electrically conducting transmission wires. The fibers are inexpensive and compact, and they are compatible with transmitters, repeaters and receivers of miniature size.

In practical light-wave or optical transmission systems, there is a need for connectors to couple optical fibers together. Installation and maintenance of such systems will require insertion, removal and testing of network components which entails connecting and disconnecting optical fibers. It is desirable if such connectors of optical fibers are small, convenient to use, relatively maintenance free, and provide high transmission efficiency for the passage of light between the optical fibers being joined. Obviously, the connectors should also be relatively inexpensive to make.

Various connectors have been devised, but the susceptibility of the optical fiber to surface defects and the inherent deviation in the diameter of manufactured fibers have hampered prior art connectors from fulfilling all of the desirable properties of an ideal connector. One approach that appears promising is to mold the connector body around the optical fiber. However, due to the small cross-sectional dimensions and attendant tolerance deviations of manufactured optical fibers, such molded connector bodies must have a precise shape.

Accordingly, it is an object of this invention to provide a precisely molded connector which does not require additional machining to remove surface defects.

SUMMARY OF THE INVENTION

In accordance with the method and apparatus of the present invention, the end portion of an optical fiber including a sleeve-like member is placed in the cavity of a molding die. A port of the sleeve-like member is located in the vicinity of the cavity that forms the predetermined mating portion of the connector and defines the location of an axis which the location of the optical fiber is referenced. As the mold is injected with filler material, the port of the member accepts a flow of the filler material including entrapped gas bubbles. This action prevents gas bubbles from residing on the surface of the predetermined mating portion enabling its precise formation when the filler material solidifies. Since the connector body is molded with the optical fiber precisely located in the cavity, the self-aligning shape of the mating portion provides a convenient and durable connector body after solidifying the filler material which features precision alignment of the optical fiber.

In some of the more specific aspects of the invention, the predetermined mating portion corresponds to a frustum of a cone and the sleeve-like member has a port located in the tip of the frustum. The other end of the member is located in an orifice whose center corresponds to the axis. The material of the sleeve-like member is metal and is crimped to secure the optical fiber.

In an alternative illustrative embodiment of the invention, the sleeve-like member is modified so that the optical fiber may terminate into an optical transducer. The modified member is adapted to be movable on the optical fiber during the molding process and the end at the tip of the mating surface is notched to accept a flow of filler material. These notches insure the positive effect during the molding process even though the modified member is moved to the end of the molding cavity.

BRIEF DESCRIPTION OF THE DRAWING

A more complete understanding of the invention and the various features, additional objectives and advantages thereof may be more readily appreciated and better understood by reference to the following detailed description in conjunction with the drawing.

DETAILED DESCRIPTION

Figure 1A:
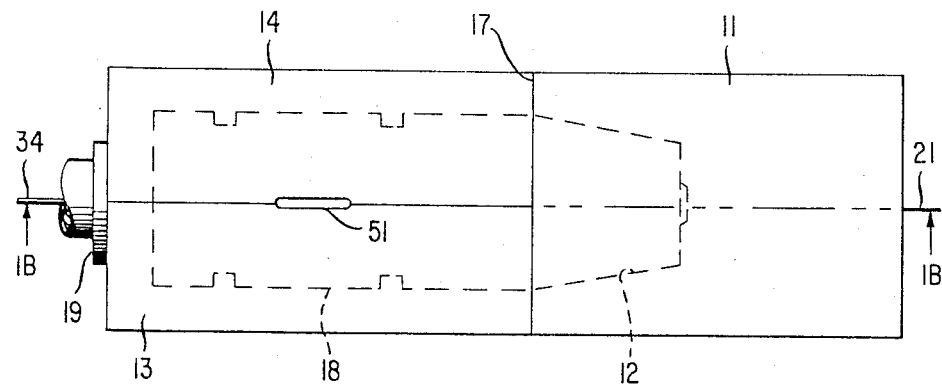
FIGS. 1A and 1B are respectively simplified and partially disassembled detailed cross-sectional views of a molding die assembly in accordance with the inventive principles.
Figure 1B:
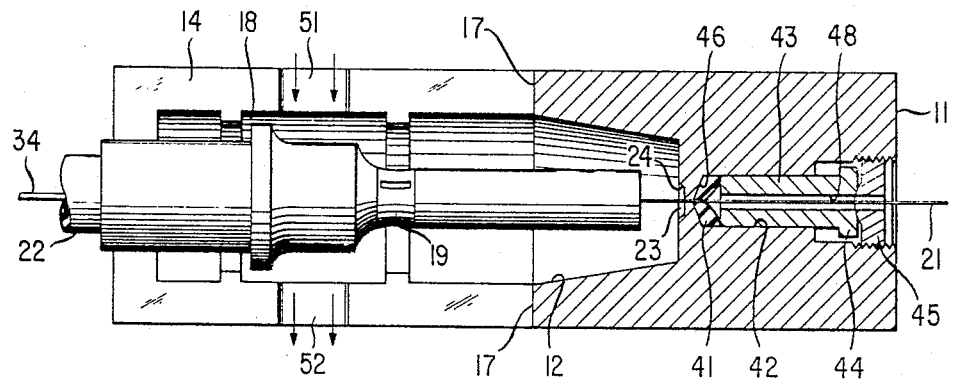

The connector body used in the present invention is conveniently and inexpensively manufactured by the use of a molding assembly such as that illustrated in FIGS. 1A and 1B. The invention herein described pertains to the method and apparatus for forming an exact connector body including a precision mating surface. The assignee hereof is also the assignee of other patent applications entitled "Optical Fiber Connector and Method of Making," Ser. No. 630,930, filed Nov. 11, 1975, of Peter K. Runge, and a divisional application thereof under the same title, Ser. No. 789,549, filed Apr. 21, 1977 now U.S. Pat. No. 4,107,242. The inventions of these patent applications are directed to other aspects of this type of connector bodies which are adapted to be coupled together typically through a biconical socket arrangement.

FIG. 1A is a simplified version of precision molding die 11 which has a precision machined frustum cavity 12. Precision die 11 is placed in a holder (not shown) together with lower connector-body block 13 and upper connector-body block 14. When die 11 interfaces with blocks 13 and 14 at plane or side 17 of die 11, a molding cavity is completed comprising a cylindrical cavity 18 extending from the larger base portion of frustum cavity 12 for forming connector bodies.

In FIG. 1B, wherein the same reference numerals are used for corresponding elements in FIG. 1A, precision molding die 11 is shown in cross section. Body block 14 is shown exposed without the presence of body block 13. This arrangement provides an unobstructed view of cavity 12, 18 wherein sleeve 19, not shown in cross section, surrounds optical fiber 21. Optical fiber 21 is clamped or otherwise held concentrically in the molding cavity 12, 18. Coaxial cable 22 houses fiber 21 outside the connector body which is formed to be in cavity 12, 18 and serves to align the fiber with respect to orifice 23.

Figure 2:
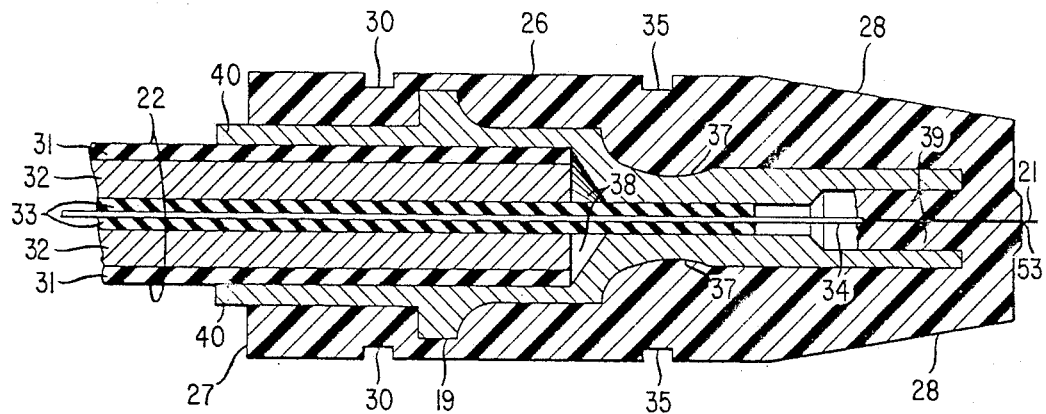
FIG. 2 is a cross-sectional view of an optical fiber connector formed using the illustrative die assembly.

Before the remaining portion of FIG. 1B is described, FIG. 2 will be referred to primarily because it provides an enlarged detailed cross sectional view of sleeve 19. Sleeve 19 is a metal sleeve such as brass. FIG. 2 also illustrates formed connector body connector 26 with the larger end of sleeve 19 extending through back 27 of the connector body. In this case, fiber 21 and sleeve 19 are a subassembly of connector body 26 and become an integral part thereof during the molding process. As will be appreciated by those in the art more fully hereinafter, conical portion 28 is the precision mating surface of the connector that is molded to conform to cavity 12 during which sleeve 19 has a positive effect in removing voids in the molding material.

Coaxial cable 22, also illustrated in cross section in FIG. 2, houses and protects fiber 21 exterior to connector back 27, while keeping the fiber in place within the confines of sleeve 19. Cable 22 typically includes outer protective plastic sheath 31, metallic braiding 32, Teflon center insulator 33, which easily accommodates concentricity to the fiber, and Nylon coating 34. Teflon member 33 and Nylon member 34 of cable 22 extend into sleeve 19 and is crimped at 37. The crimps at 37 secure fiber 21 and serve to align the fiber with respect to orifice 23 of FIG. 1B during molding. This arrangement also prevents flow of molding material past these points and into cavity 38 of sleeve 19 when connector body 26 is formed.

In order to form a connector body 26, the sleeve-like subassembly portion of FIG. 2 is placed in cavity 18 of FIG. 1B. The subassembly is supported in a cylindrical recess formed partially in body block 14 and partially in body block 13 (not shown). Optical fiber 21 is guided into orifice 23 by chamfer 24 so that the orientation of the axis of the fiber is aligned coaxially with the frustum-shaped die cavity 12 with an angular error suitably less than one degree.

In FIG. 1B, precise centering and sealing of fiber 21 in orifice 23 is accomplished by the compression of annulus 41 in channel 42 by piston 43. Piston 43 has head 44 which serves as a bearing surface when screw 45 is tightened. Screw 45 has a slot for screwdriver adjustment from the exterior of the die assembly. Annulus 41 is previously suitably molded around a concentrically chamfered pin using a molding substance of a silicone rubber or other material able to withstand elevated temperatures experienced during molding and exhibit essentially no decomposition when heated in a confined space. The temperature-vulcanizing potting resin Dow Corning Sylgard 185 is suitable for the purpose, and is commercially available from Dow Corning, Midland, Michigan.

Precision chamfer 46 is designed to enhance the centering capabilities of annulus 41. Chamfer 46 is made concentric with the tapered surface of cavity 12 to within less than a micron, but the chamfer apex half-angle is not critical and suitably 75 degrees.

Annulus 41 is compressed until fiber 21 may just be admitted along guide chamfer 24, through orifice 23, through annulus 41 and about two centimeters further through channel 48 in piston 43. Nylon or other soft coating 34 on fiber 21 (shown in FIG. 2 but not in FIG. 1B) is employed to protect the surface of the fiber from being damaged. In this case, however, coating 34 should previously be stripped at least in the region between sleeve 19 and piston 43 for the most precise centering of fiber 21. After this, fiber 21 is ultrasonically cleaned to allow optimum admittance along guide chamfer 47. Then the assembly of lower body block 13, upper body block 14 and precision die 11 is put together and elevated in temperature.

The molding or filler material is preferably an epoxy resin that is fed into die 11 from the back of the molding die through port 51. During this process, which is known as transfer molding, there is an inherent tendency for gas pockets to form and to reside on the surface of the molding cavity in region 12. These gas pockets, if not removed or relocated, would prevent the formation of a smooth mating surface necessary for good connector formation. The insertion of sleeve 19 serves as a receiver for the gas pockets. As it is fed into the mold, the epoxy is forced forward to conical tip of region 12 of the molding cavity. This conical shape induces a direction of flow that leads the gas pockets and epoxy into outer cavity 39 of sleeve 19 in FIG. 2. The crimps at 37 on center insulator 33 and coating 34 in FIG. 2 prevent the flow of filler material past it. In addition to enabling the formation of a smooth mating surface on the connector, sleeve 19 serves to hold fiber 21 securely in position and prevents the possibility of a deflection of the fiber as the molding cavity is injected with filler material.

Desirable properties of the transfer molding compound are good dimensional stability, linear shrinkage, low coefficient of expansion, and abrasion resistance. The molding flow should be soft as to minimize possible fiber deflection or breakage. A short thermosetting time is desirable to reduce the cycle time of manufacture. Moldable polyesters and moldable epoxies are convenient and suitable for use as the moldable compound. Inclusion of silica or other mineral fillers stabilizes the molding medium, reduces shrinkage, and improves surface abrasion resistance. A highly useful molding produce utilized in obtaining the advantages of the present invention was Hysol Epoxy Molding Powder, MG6 Mineral Filled, which, as sold by the Hysol Division of the Dexter Corporation, Olean, New York, refers by label to U.S. Pat. No. 3,484,398.

The MG6 molding powder is preheated for six minutes at 85 degrees Centigrade. Vacuum gate 52 is used as a port for evacuating the molding die cavity to 0.01 Torr just prior to admission of the molding compound. Then the MG6 is forced at 410 to 450 pounds per square inch through 2 mil wide entry gate 51 into the cavity which is at a temperature in the range of 150 degrees to 160 degrees Centigrade. The width of the vacuum gate 52 is one mil, which is small enough so that the mineral filled transfer molding compound admitted at entry gate 51 cannot leave through the vacuum gate. The molding compound after passing through entry gate 51 surrounds sleeve 19 as it rapidly fills regions 12 and 18 of the molding cavity including chamfer 24 extending to orifice 23, which is closed at the transfer molding temperature by thermal expansion of annulus 41. The molding compound entrains any residual gas in cavity 12 and carries it into the interior of sleeve 19. In this manner, a connector body having a precisely conical frustum mating surface is molded around fiber 21, which in turn is accurately aligned coaxially with the conical frustum mating portion of the molded body. The connector bodies produced had dimensions as follows: 6.34 millimeter cylinder body diameter, 10 degrees taper apex half-angle, and 5.6 millimeter taper length. The molded body is cured for five minutes, cooled to relax the annulus, removed from the mold, and postcured for four hours at 150 degrees Centigrade.

It should be clear that many of the details of the molding process are related to the properties of the specific molding compound employed. Thus, while Hysol MG6 was used in demonstrating the invention, the scope of the inventive method is not intended to be limited by the above disclosure of a particular process for transfer molding one substance around the fiber since other substances or newly devised compounds may also provide suitable results.

After postcuring, sleeve 19 of FIG. 2 is crimped at 40, and fiber 19 is cut in the vicinity of 53. The preliminary cut is induced by scoring fiber 21 at 53 with a diamond along one side of the fiber then an axial tensile load is placed upon the fiber resulting in fracture. The end of fiber 21 is then lapped down and polished to provide a smooth surface. The tool or jig used for lapping and polishing should also insure that the plane of the polished surface is perpendicular to the axis of fiber 21. Further information on fiber end preparation may be obtained by reference to "Optical Fiber End Preparation for Low-Loss Splices" by D. Gloge et al, *Bell System Technical Journal,* Vol. 52, No. 9, November, 1973, pp. 1579-1588. The crimps at 40 mechanically secures cable 22 to connector body 26.

Figure 3:
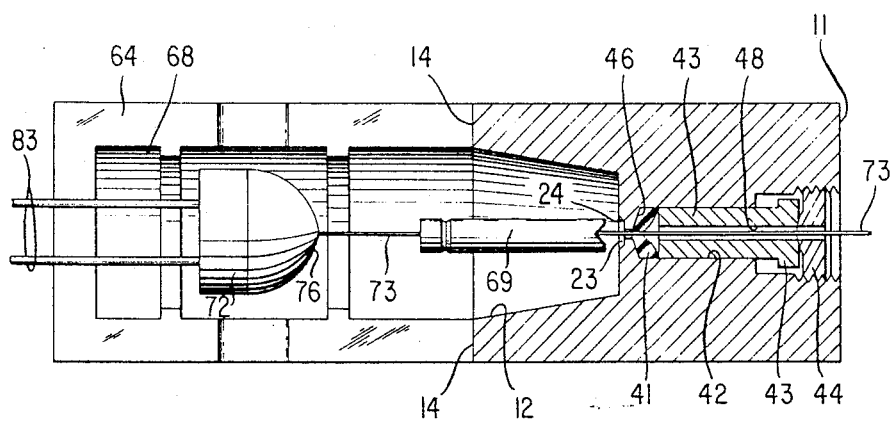
FIG. 3 is a partially disassembled die assembly applying the inventive principles to provide optical fiber connectors including light emitting or light receiving devices.
Figure 4:
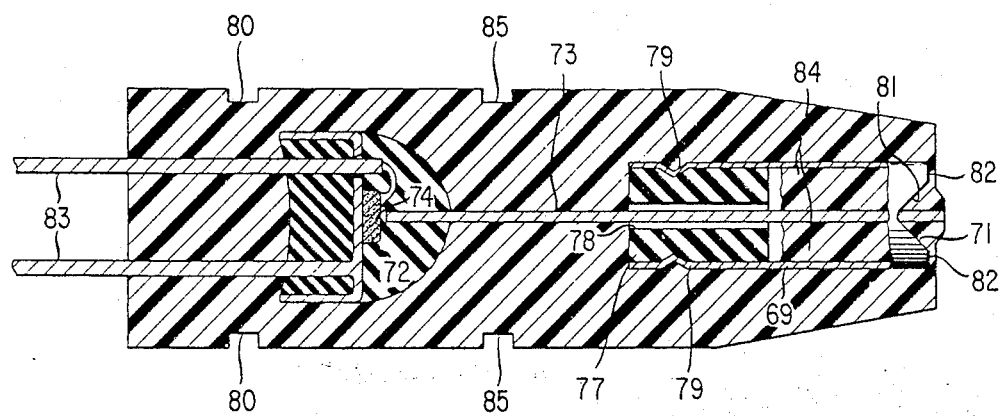
FIG. 4 is a detailed cross-sectional view of a connector formed in accordance with FIG. 3.

The inventive principles may be readily used to provide a similar type connector body which employs an optical transducer as shown in FIG. 3. FIG. 3 illustrates the molding die for this connector while FIG. 4 depicts a cross-sectional view of the connector thus formed. This connector includes an optical transducer which may take the form of, for example, a light emitting diode (LED), PIN diode, or some other low power device suitable as a light source or as an optical detector. Alternately, body blocks 64 and 63 (not shown in FIG. 3) may be adapted to include a heat sink such that a high power optical device may be housed in the connector of FIG. 4. Accordingly, the connector body now formed may advantageously act as a transmitter or a receiver to interface a transmission medium comprising optical energy guided by optical fibers with conventional electronic circuitry. It should be noted that the shape of the connector body and the mold are essentially the same as those of FIG. 1B. Furthermore, the techniques as well as the materials used in the manufacturing processes may be the same as those used to form the connector body of FIG. 1B. The primary differences in the connector of FIG. 3 with respect to that of FIG. 1B are concerned with the optical fiber and its subassembly.

Reference to FIG. 4 will serve to explain the structure of metal sleeve 69 shown in detail in a cross section of a molded connector. Sleeve 69 of this arrangement is also part of a subassembly used in the molding process for a precise mating surface. Its orientation within the connector is such that the open end 71 of sleeve 69 faces the tip of the mating surface. The subassembly includes optical device 72 affixed to optical fiber 73. In this case, fiber 73 is affixed to the window 74 of optical device 72 by a suitable adhesive such as time curing epoxy 76. Fiber 73 is fed through sleeve 69, then this subassembly is situated so that fiber 73 is held concentrically in molding cavity 12, 68 of FIG. 3. Die 11 of FIG. 1B is also used to form the connector of FIG. 4 and is thus shown in FIG. 3. Sleeve 69, which is shorter than sleeve 19 in FIG. 1B, surrounds fiber 73 but does not extend out of the connector body.

The end of sleeve 69 nearest to device 72 has a Teflon cylindrical plug 77. Plug 77, which has hole or channel 78 through its center along the axis of its cylindrical shape, is placed inside sleeve 69 and is secured by being crimped at 79. Hole 78 is made large enough so that sleeve 69 is capable of sliding along the length of fiber 73.

The other end of sleeve 69 is serrated by notches 81 to form at least four standoff points 82. Notches 81 have been introduced in order to facilitate precise formation of mating surfaces. Since gas pockets will form during the molding process, sleeve 69 is placed around fiber 73 to collect these gas pockets. The removal of these gas pockets allows the formation of a smooth mating surface.

Before molding the connector of FIG. 4, the subassembly portion of FIG. 4 is placed in the die assembly of FIG. 3. Fiber 73 is threaded through sleeve 69 and guided into orifice 23 by chamfer 24 so that the end of the fiber is aligned coaxially with the frustum-shaped portion 12 of the die cavity. Fiber 73 is also situated to have electrical conductors 83 of device 72 extending through cavity 68 and out of block 64.

As filler material is fed into cavity 12, 68, sleeve 69 may, very likely, be forced to the front of the mold. To insure the passage of filler material including gas pockets into cavity 84 of sleeve 69, notches 81 (not shown in FIG. 3 but shown in FIG. 4) allow a passageway for the filler material, even though sleeve 69 is forced all the way to the front of the molding die cavity 12. Plug 77 crimped at 79 prevents any outflow of residue epoxy from the back of sleeve 69. As in the case of sleeve 19 of FIG. 1B when the filler material enters from the back of the molding cavity of FIG. 3, its motion forces the epoxy to flow into sleeve 69 including any formed gas pockets thereby allowing the formation of a smooth mating surface. After curing and post curing, in accordance with the particular filler material being used, fiber 73 is cut and finished by using the same procedure as for the connector of FIG. 2.

Another feature of the molded connector bodies of FIGS. 2 and 4 are grooves around the circumference of the cylindrical shaped bodies. These are shown as grooves 30 and 35 in FIG. 2 and as grooves 80 and 85 in FIG. 4. These grooves are adapted to accommodate snap rings. The snap rings when placed in these grooves retain a nut whose threads draws the connector body into a biconical socket adapter. While the connector body is mated with the adapter, the snap rings in grooves 35 and 85 provide the bearing surface which holds the connector body securely in position.

It is of course to be understood that the embodiments of the present invention hereinabove discussed are merely illustrative of an even wider variety of embodiments useful in practicing the invention. For instance, those skilled in the art may readily incorporate a heat sink into the body of the connector of FIG. 4 so that a high power optical device, e.g., a laser, may be utilized. In addition, flexible material whose index of refraction matches that of the optical fiber may be placed on the tip of the mating surface to provide a flexible optical coupling arrangement. In all cases, the scope of the invention is to be interpreted as defined by the appended claims.

What is claimed is:

1. In a method of molding an optical fiber connector having a precisely formed mating surface, the steps comprising:

providing a molding die having a cavity with a predetermined shaped portion at one end for defining the mating surface and an axis, the other end of said cavity having a base wherein at least one orifice is located precisely in respect to said axis;

guiding an optical fiber through a first end of an elongated sleeve-like member to form a subassembly, said member being hollow throughout its length for passing said fiber;

positioning the first end of said member of said subassembly in said cavity so that said optical fiber is precisely located with respect to said axis while the other end of said member is in the proximity of the predetermined shaped portion of said cavity;

filling said cavity with a filler material so that said member accepts a flow of filler material including any gas pockets formed in the filler material to allow complete filling and conforming to the predetermined portion; and solidifying said filler material to form a durable molded body around said optical fiber.

2. In the method according to claim 1 wherein said predetermined shape corresponds to a frustum of a cone and the other end of said subassembly is located in the tip of said frustum.

3. In the method according to claim 2 wherein the center of said orifice is located to correspond to said axis and said orifice has a size and shape corresponding to the first end of said member of said subassembly, and the step of positioning includes placing the first end of said member of said subassembly into said orifice.

4. In the method according to claim 2 after the step of guiding, further includes the step of affixing an optical transducer to the optical fiber to couple optical energy therebetween and the base of said cavity includes two orifices each adapted to receive an electrical conductor from the optical transducer.

5. In the method according to claim 3 wherein the sleeve-like member is metal and after the step of guiding, includes crimping the metal member to secure the optical fiber.

6. An optical fiber connector having a body molded from a filler material comprising:

a first portion of said molded body having a predetermined shape that precisely defines the location and orientation of a first axis;

guiding means for directing optical energy indicative of at least one information signal along at least one path; and a sleeve-like member embedded in said molded body, said member being elongated and having first and second ends, said member having a channel therethrough coinciding with said first axis, said channel forming first and second ports respectively at said first and second ends, said guiding means extending through said first port and through said channel beyond said second port, said second port located in said first portion, said second port accepting a flow of filler material including voids therein produced by entrapped gas pockets formed when said body is molded thereby removing the voids from preventing the formation of said predetermined shape.

7. A connector according to claim 6 further comprising a transducer embedded in said molded body and affixed to said guiding means to communicate therewith.

8. A connector according to claim 7 wherein said sleeve-like member is adapted to be movable on said guiding means and said second port includes at least one notch for accepting the flow of filler material when said member is moved to the end of said body as it is being molded.

9. A connector according to claim 8 said sleeve-like member is a metallic tube comprising a Teflon plug inserted into said first port, said plug having a channel wherein said guiding means is located.

10. A connector according to claim 9 wherein the first portion of said molded body corresponds to a conical frustum and serves as the mating portion of said connector.

* * * * *